United States Patent
Tasi et al.

(10) Patent No.: US 7,037,741 B2
(45) Date of Patent: May 2, 2006

(54) COMPOUND SEMICONDUCTOR OPTOELECTRONIC DEVICE

(75) Inventors: Tzong-Liang Tasi, Hsinchu (TW); Yung-Chuan Yang, Hsinchu (TW); Chih-Sung Chang, Hsinchu (TW); Tzer-Perng Chen, Hsinchu (TW)

(73) Assignee: Epistar Corporation, (TW)

( * ) Notice: Subject to any disclaimer, the term of this patent is extended or adjusted under 35 U.S.C. 154(b) by 0 days.

(21) Appl. No.: 10/796,823

(22) Filed: Mar. 8, 2004

(65) Prior Publication Data

US 2004/0232436 A1 Nov. 25, 2004

(30) Foreign Application Priority Data

Mar. 28, 2003 (TW) .............................. 92107143 A

(51) Int. Cl.
*H01L 33/00* (2006.01)
(52) U.S. Cl. ............................ 438/38; 438/46; 438/47; 438/780
(58) Field of Classification Search ................. 438/38, 438/46, 47, 780

See application file for complete search history.

(56) References Cited

U.S. PATENT DOCUMENTS

| | | | | |
|---|---|---|---|---|
| 4,255,207 | A * | 3/1981 | Nicolay et al. | 438/427 |
| 5,500,389 | A * | 3/1996 | Lee et al. | 438/492 |
| 5,658,823 | A * | 8/1997 | Yang | 438/38 |
| 5,889,806 | A * | 3/1999 | Nagai et al. | 372/45.01 |
| 5,953,581 | A * | 9/1999 | Yamasaki et al. | 438/22 |
| 6,537,839 | B1 * | 3/2003 | Ota et al. | 438/22 |
| 6,555,846 | B1 * | 4/2003 | Watanabe et al. | 257/94 |
| 6,610,144 | B1 * | 8/2003 | Mishra et al. | 117/95 |
| 6,891,268 | B1 * | 5/2005 | Tomiya et al. | 257/744 |
| 2004/0067648 | A1* | 4/2004 | Morita et al. | 438/689 |
| 2004/0152226 | A1* | 8/2004 | Hahn et al. | 438/46 |
| 2004/0169192 | A1* | 9/2004 | Kato et al. | 257/103 |

* cited by examiner

Primary Examiner—Bradley K. Smith
Assistant Examiner—Steven Fulk
(74) Attorney, Agent, or Firm—Anthony R. Barkume, P.C.

(57) ABSTRACT

A method for manufacturing a compound semiconductor optoelectronic device is proposed. There are steps of: forming an optoelectronic device epitaxial wafer, the optoelectronic device epitaxial wafer containing a V-shaped pit due to threading dislocation; forming an insulated isolation material in the V-shaped pit of the optoelectronic device epitaxial wafer; and forming an electrode layer on the optoelectronic device epitaxial wafer having the insulated isolation material in the V-shaped pit for completing the optoelectronic device.

7 Claims, 6 Drawing Sheets

US 7,037,741 B2

COMPOUND SEMICONDUCTOR OPTOELECTRONIC DEVICE

FIELD OF THE INVENTION

The present invention is related to a compound semiconductor optoelectronic device, and more particularly to optoelectronic device having an insulated isolation material in the V-shaped pits.

BACKGROUND OF THE INVENTION

Compound semiconductor optoelectronic device includes light emitting diodes (LED) and laser diodes. There is a dislocation situation in the epitaxy process so that a V-shaped pits may be issued.

FIG. 1 shows the cross section of a conventional LED device. The LED device wafer includes an $Al_2O_3$ substrate 100, a buffer layer 102, a n-GaN (Gallium-Nitride) layer 104, a MQW (Multi-Quantum-Well) layer 106, a p-AlGaN layer 108 and a p-GaN layer 110. There is a V-shaped pit 120 on the p-GaN layer 110.

The V-shaped defect may cause some disadvantages on LED or laser diode. At first, the V-shaped groove makes a channel so that the static electricity may easily pass through and damage the semiconductor structure. Secondly, a large reverse current and leakage current may be issued to make the power loss of the diode. Straightforwardly the mentioned disadvantages will directly make a bad lighting result on the semiconductor luminescent apparatus. They are the main issues that the present invention is proposed to resolve.

SUMMARY OF THE INVENTION

An objective of the present invention is to provide a method to fill the insulated isolation materials in the V-shaped pits in order to prevent from the damage of the static electricity, the large reverse current and the large leakage current.

Another objective of the present invention is to provide a semiconductor optoelectronic device having the insulated isolation materials in the V-shaped pits to improve the lighting performance.

According to the present invention, a method for manufacturing a compound semiconductor optoelectronic device comprises steps of:

forming a compound semiconductor optoelectronic device epitaxial wafer, the optoelectronic device containing a V-shaped pit due to threading dislocation;

forming an insulated isolation material in the V-shaped pit of the optoelectronic device; and forming an electrode layer on the optoelectronic device having the insulated isolation material in the V-shaped pit for completing the optoelectronic device.

In accordance with one aspect of the present invention, the optoelectronic device epitaxial wafer includes an $Al_2O_3$ substrate, a n-GaN (Gallium-Nitride) layer, a MQW (Multi-Quantum-Well) layer, a p-AlGaN layer and a p-GaN layer.

In accordance with one aspect of the present invention, the method of forming said insulated isolation material comprises steps of:

forming the insulated isolation material layer on the V-shaped surface; and removing the insulated isolation material layer but leaving the insulated isolation material in the V-shaped pit.

In accordance with one aspect of the present invention, the method of forming the insulated isolation material layer is by deposition.

In accordance with one aspect of the present invention, the method of removing the insulated isolation material layer is by polishing.

In accordance with one aspect of the present invention, the method of removing the insulated isolation material layer is by etching.

In accordance with one aspect of the present invention, the method of removing the insulated isolation material layer is by reactive ion etching(RIE) and the optoelectronic device epitaxial wafer is inclined.

In accordance with one aspect of the present invention, the method of forming said insulated isolation material layer is by coating an organic material.

According to the present invention, a compound semiconductor optoelectronic device comprises:

an optoelectronic device epitaxial wafer, the optoelectronic device epitaxial wafer containing a V-shaped pit due to threading dislocation;

an insulated isolation material in the V-shaped pit of the optoelectronic device epitaxial wafer; and an electrode layer on the optoelectronic device epitaxial wafer having the insulated isolation material in the V-shaped pit.

In accordance with one aspect of the present invention, the insulated isolation material is an organic material.

In accordance with one aspect of the present invention, the organic material is polyimide, epoxy, or benzocyclobutene (BCB), etc.

In accordance with one aspect of the present invention, the insulated isolation material is an inorganic material.

In accordance with one aspect of the present invention, the inorganic material is $SiO_2$, $Si_3N_4$, TiN, AlN, $Al_2O_3$, MgO, $GaF_2$, ZnS, SiC, etc.

In accordance with one aspect of the present invention, the optoelectronic device epitaxial wafer includes an $Al_2O_3$ substrate, a n-GaN (Gallium-Nitride) layer, a MQW (Multi-Quantum-Well) layer, a p-AlGaN layer and a p-GaN layer.

In accordance with one aspect of the present invention, the electrode layer includes a P type metal electrode, a N type metal electrode and a transparent conducting layer (TCL).

The present invention may best be understood through the following description with reference to the accompanying drawings, in which:

DETAILED DESCRIPTION OF THE PREFERRED EMBODIMENT

Figure 1:
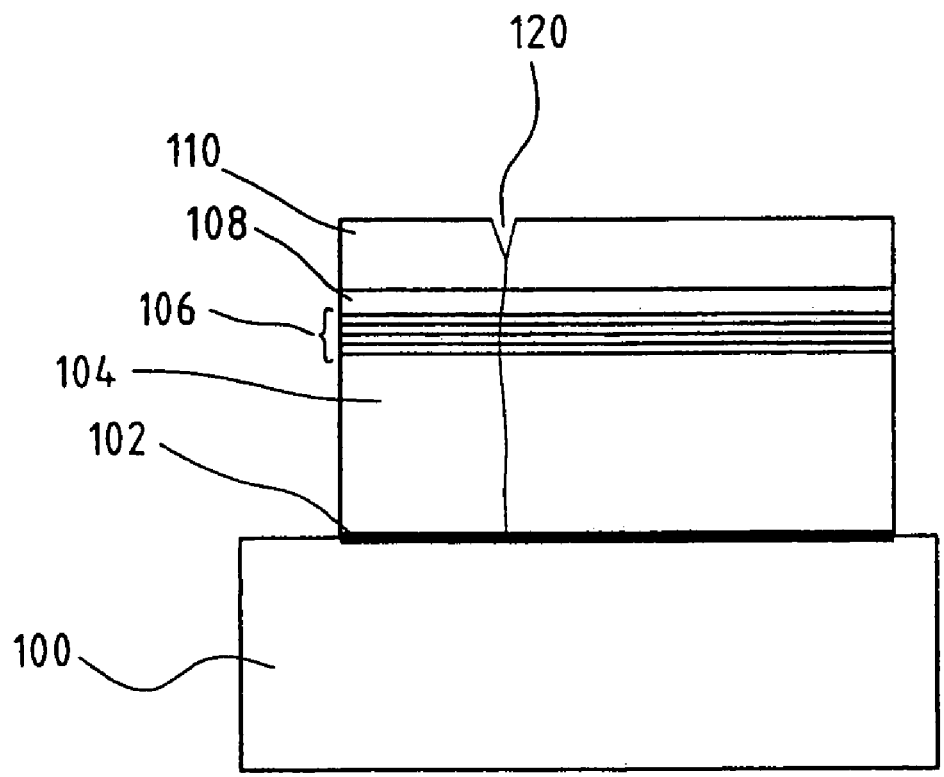
FIG. 1 shows the crosss section of a conventional LED device epitaxial wafer.
Figure 2:
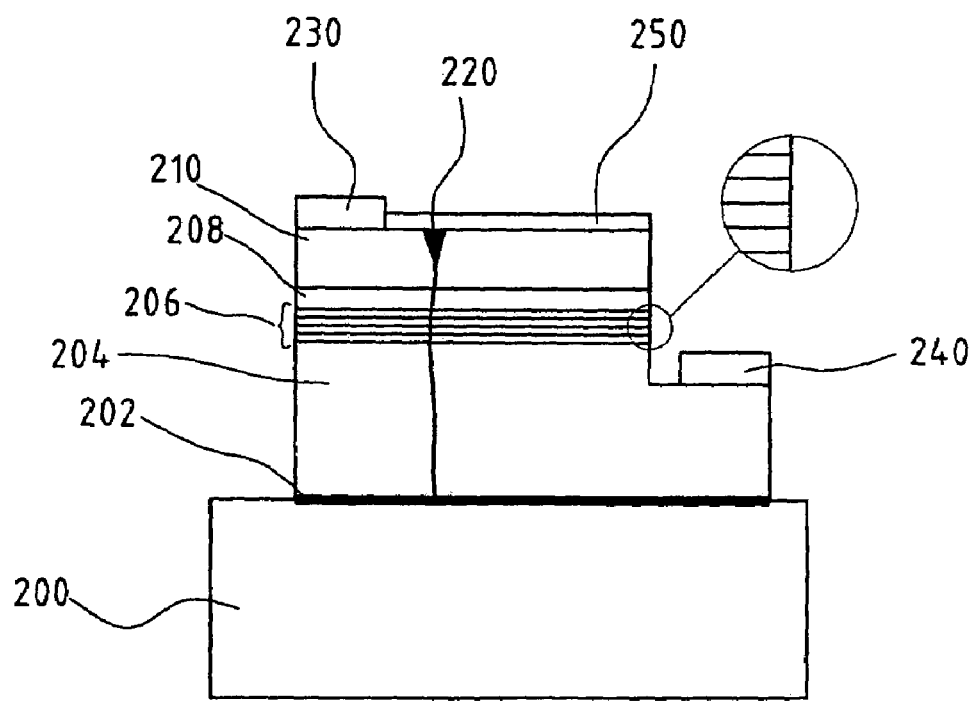
FIG. 2 shows the LED device structure according to present invention.

FIG. 2 shows the LED device structure according to the present invention. The LED device structure includes an Al$_2$O$_3$ substrate 200, a buffer layer 202, a n-GaN (Gallium-Nitride) layer 204, a MQW (Multi-Quantum-Well) layer 206, a p-AlGaN layer 208, a p-GaN layer 210, a P type electrode 230, transparent conducting layer (TCL) 250, a N type electrode 240 and the insulated isolation material 220.

The insulated isolation material 220 is the main feature different from the conventional skill. The insulated isolation materials 220 can prevent LED ( or laser diode) from the damage of the static electricity, the large reverse current and the large leakage current and improve the lighting performance.

Figure 3:
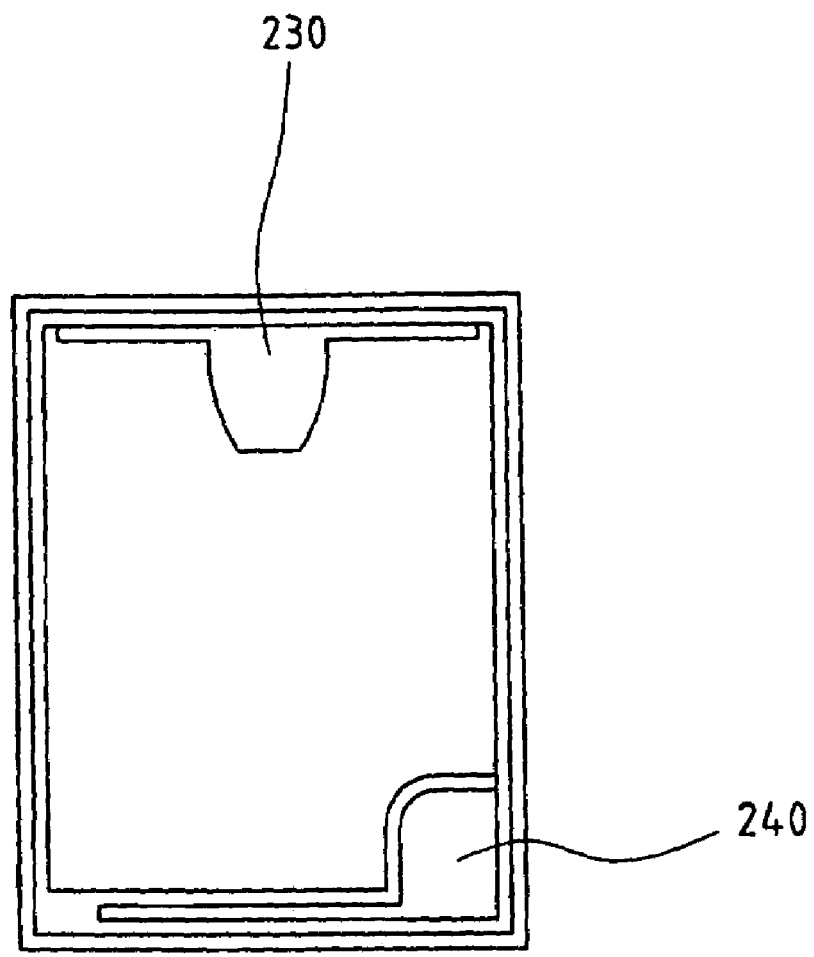
FIG. 3 shows the top view of FIG. 2.

The insulated isolation material 220 may be an organic material such as polyimide, epoxy, o r benzocyclobutene, etc. Or, it may be an inorganic material such as SiO$_2$, Si$_3$N$_4$, TiN, AlN, Al$_2$O$_3$, MgO, GaF$_2$, ZnS, SiC, etc. Besides, FIG. 3 shows the top view of FIG. 2.

Figure 5:
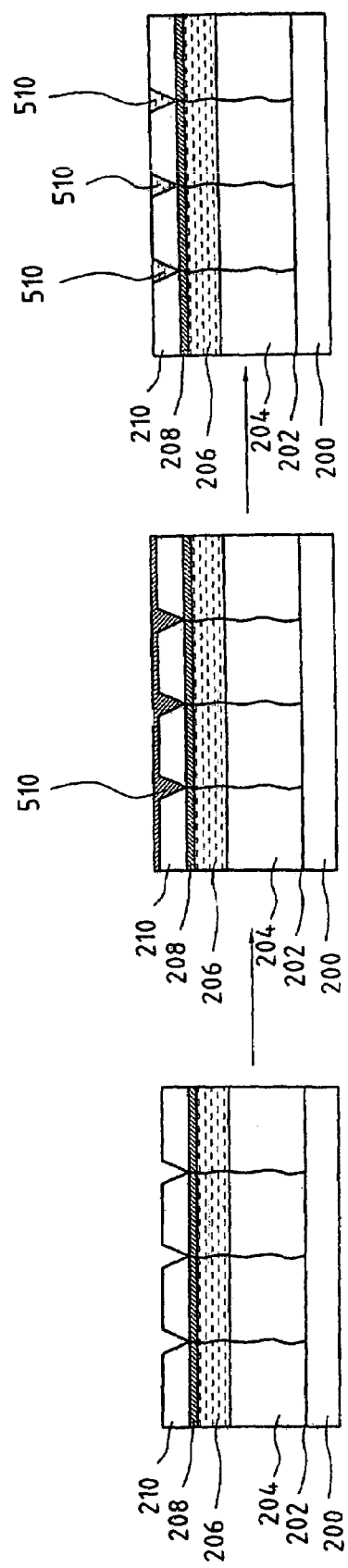
FIG. 5 shows a preferred process of LED epitaxial wafer according to the present invention.

FIG. 5 shows a preferred process of LED epitaxial wafer according to the present invention. The process comprises following steps:

Put the Al$_2$O$_3$ substrate 200 for epitaxial process into the reactor. Have hydrogen at 1150° C. to clean down the wafer for 10 minutes. Then cool down to 570° C. and set TMGa (Trimethylgallium) flow rate of 45 μmol/min and NH$_3$ flow rate of 3 l/min for forming the GaN buffer layer 202 of 250 angstrom (Å).

Rise the temperature to 1130° C. and set TMGa flow rate of 52 μmol/min and NH$_3$ flow rate of 35 l/min. Flow 100 ppm SiH$_4$ for growing the n-GaN layer 204 of 3 μm Cool down to 850° C. Set the TMGa flow rate of 30 μmol/min, TMln (Trimethylindium) flow rate of 30 μmol/min and NH$_3$ of 3.5 l/min for growing the active region of 11 pairs of InGaN/GaN MQW (Multiple Quantum Well) layer 206.

Rise the temperature of the substrate to 1100° C. Set TMGa flow rate of 42 μmol/min, TMAl of 20 μmol/min, NH$_3$ of 3.5 l/min, and DCpMg of 52 nmol/min for growing a P-AlGaN layer 208 of 30 nm as a cladding layer.

Then rise the temperature of the substrate to 1130° C. Set flow rate of TMGa 52 μmol/min, NH$_3$ 3.5 l/min and DCpMg 52 nmol/min for growing a P-GaN layer 210 of 0.1 μm to complete the LED epitaxial wafer structure.

Figure 4:
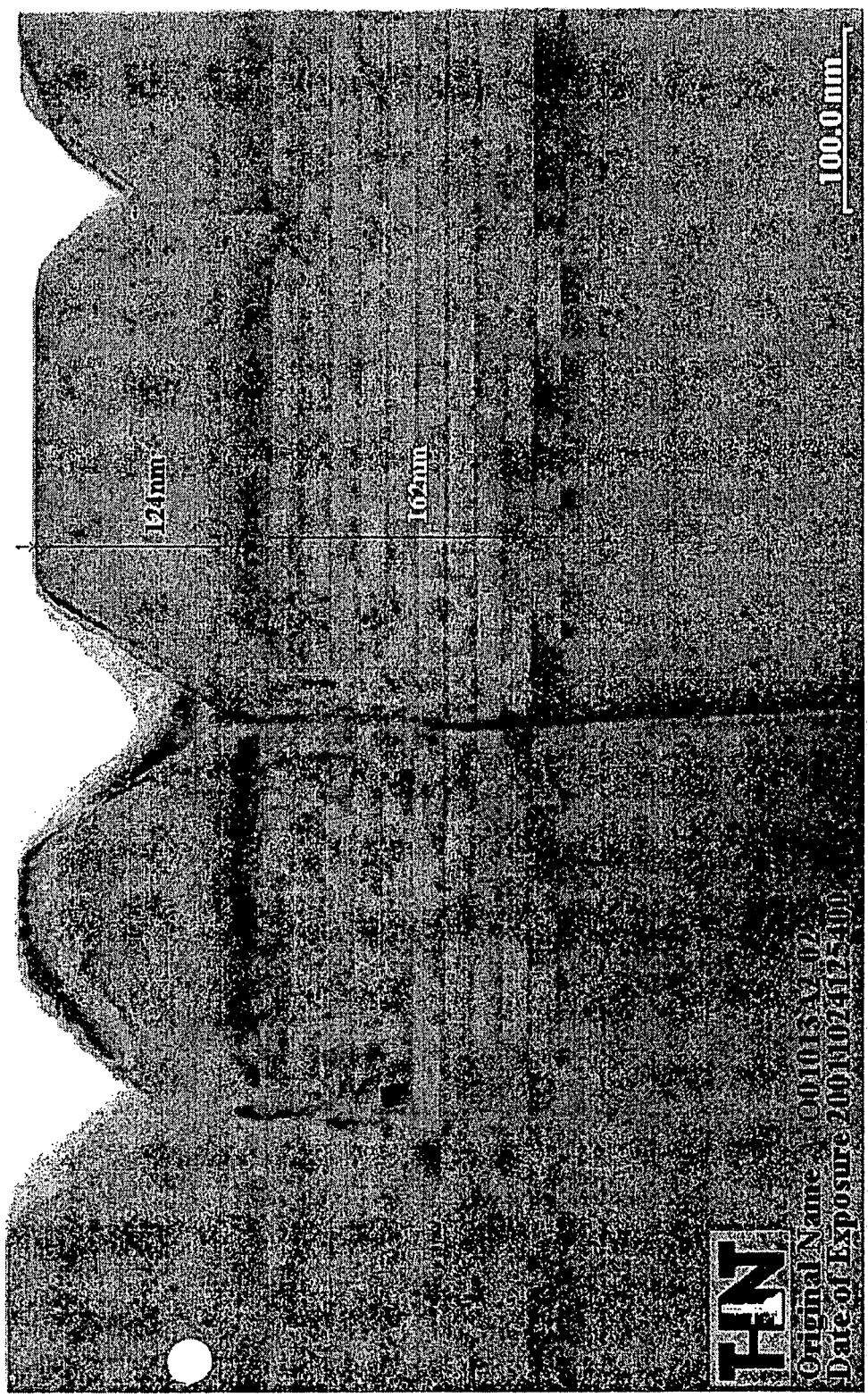
FIG. 4 shows the Transmission Electron Microscope (TEM) of V-shaped grooves.

FIG. 4 shows Transmission Electron Microscope (TEM) of V-shaped grooves. There are many V-shaped defects on the surface of LED epitaxy wafer due to the threading dislocation. We can use an organic material such as polyimide, BCB or epoxy, etc. to coat on the surface of P-GaN layer 210 to form an organic material 510. Because of the fluidity of these organic materials, the V-shaped pits may be filled completely. After the thermal treatment, the organic material 510 may be hardened, then a polishing process, a chemical etching or a dry etching may be treated to remove the organic material of the surface of P-GaN and leave the organic material 510 in the V-shaped pits.

Finally, a dry etching process may be treated to disclose the n-GaN layer 204 of the LED epitaxy wafer. Then the TCL ( Transparent Conducting Layer) is deposited on the P-GaN. After N type and P type metal electrodes are deposited on n-GaN and TCL, respectively, the LED manufacture is completed.

Figure 6:
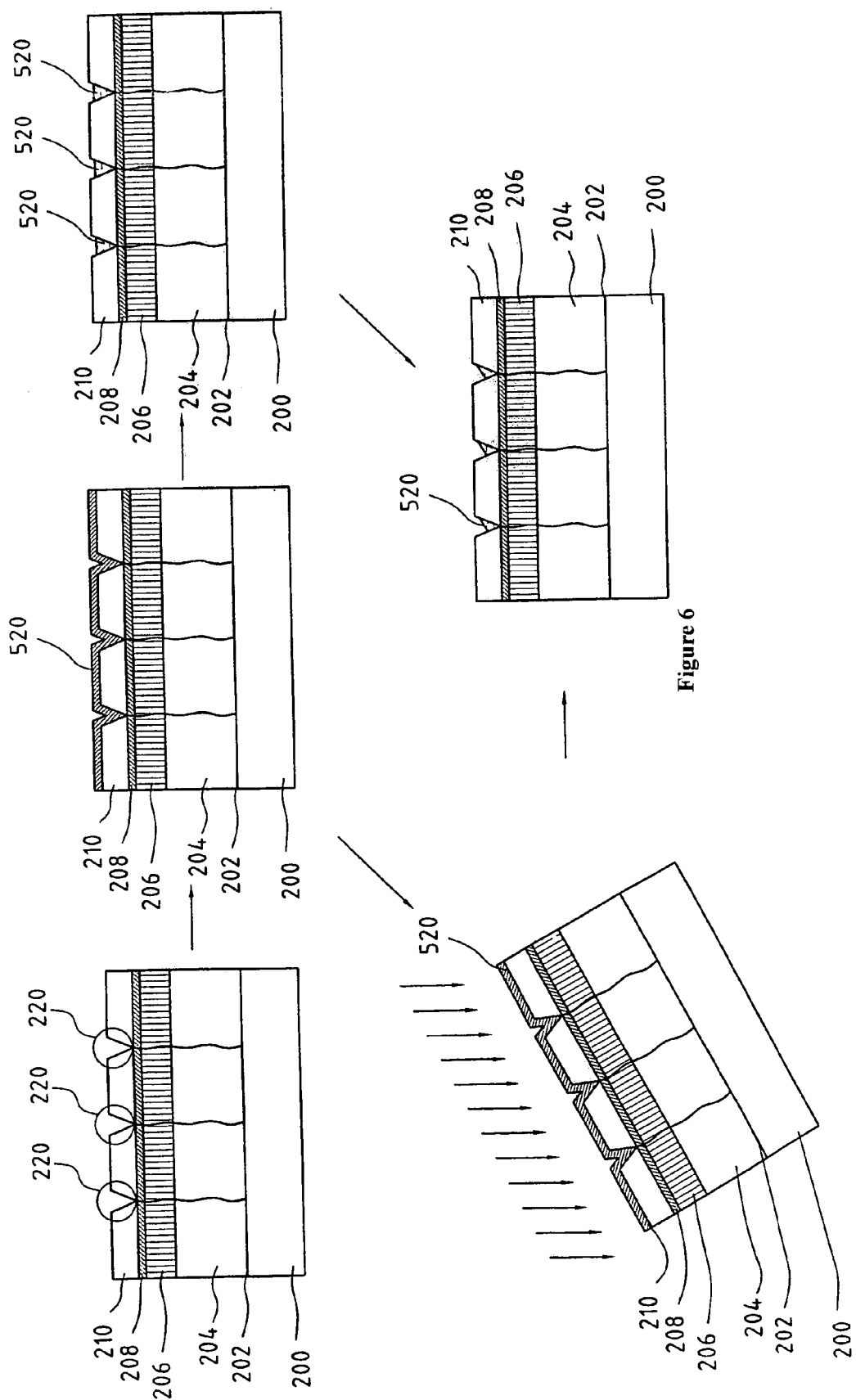
FIG. 6 shows another preferred process of LED epitaxial wafer according to the present invention.

FIG. 6 shows another preferred process of LED epitaxial wafer according to the present invention. The process comprises following steps:

After the LED epitaxial wafer is completed, the threading dislocations results m any V-shaped pits 220 on the surface of P-GaN layer 210. A deposition method is treated to form the Si$_3$N$_4$ of inorganic material 520 on the surface of P-GaN layer 210. Then the Si$_3$N$_4$ material may completely cover on the surface of P-GaN layer 210, where the V-shaped pits 220 is certainly also filled. Then a polishing process is treated to remove the Si$_3$N$_4$ material on the P-GaN surface and leave the Si$_3$N$_4$ material in the V-shaped pits 220.

Certainly a dry etching method (ex. RIE) may be used to remove the Si$_3$N$_4$ material. Before the dry etching, the LED epitaxial wafer must be inclined so that the Si$_3$N$_4$ may be leave in the V-shaped pits. Finally, after the N and P type electrodes are formed, the LED may be completed.

In conclusion, the V-shaped pits filled with insulated isolation materials can obviously prevent LED (or laser diode) from the static electricity damage, reduce the reverse current and leakage current and improve the lighting performance.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a compound semiconductor optoelectronic device comprising steps of:
    forming an optoelectronic device epitaxial wafer, said optoelectronic device epitaxial wafer containing a V-shaped pit due to threading dislocation;
    forming an insulated isolation material in said V-shaped pit of said optoelectronic device epitaxial wafer; and
    forming an electrode layer on said optoelectronic device epitaxial wafer having said insulated isolation material in said V-shaped pit for completing said optoelectronic device,
    wherein forming said insulated isolation material comprises steps of:
    forming said insulated isolation material layer on said V-shaped surface; and
    removing said insulated isolation material layer but leaving said insulated isolation material in said V-shaped pit.

2. The method according to claim 1 wherein said optoelectronic device epitaxial wafer includes an Al$_2$O$_3$ substrate, a n-GaN (Gallium-Nitride) layer, a MQW (Multi-Quantum-Well) layer, a p-AlGaN layer and a p-GaN layer.

3. The method according to claim 1 wherein forming said insulated isolation material layer is by deposition.

4. The method according to claim 3 wherein removing said insulated isolation material layer is by polishing.

5. The method according to claim 3 wherein removing said insulated isolation material layer is by etching.

6. The method according to claim 3 wherein removing said insulated isolation material layer is by reactive ion etching and said optoelectronic epitaxial wafer is inclined.

7. The method according to claim 1 wherein forming said insulated isolation material layer is by coating an organic material.

* * * * *